United States Patent
Bang et al.

(10) Patent No.: US 8,188,473 B2
(45) Date of Patent: May 29, 2012

(54) ORGANIC LIGHT EMITTING DISPLAY

(75) Inventors: Hyun-Chol Bang, Yongin (KR); Mi-Sook Suh, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 122 days.

(21) Appl. No.: 12/566,653

(22) Filed: Sep. 24, 2009

(65) Prior Publication Data

US 2010/0127264 A1    May 27, 2010

(51) Int. Cl.
    *H01L 29/04* (2006.01)
(52) U.S. Cl. .............. 257/59; 257/88; 257/E33.065
(58) Field of Classification Search ............ 257/40, 257/59, 88–89, 368, 390, E33.065, E33.053, 257/E33.067
    See application file for complete search history.

(56) References Cited

U.S. PATENT DOCUMENTS

2005/0236629 A1* 10/2005 Lee et al. ............... 257/79

FOREIGN PATENT DOCUMENTS

| JP | 2006-294421 | 10/2006 |
|---|---|---|
| JP | 2008-004837 | 1/2008 |
| KR | 10-2006-0114599 | 11/2006 |
| KR | 10-0662557 | 12/2006 |
| KR | 10-2007-0035884 | 4/2007 |
| KR | 10-2008-0003057 | 1/2008 |
| KR | 10-2008-0025500 | 3/2008 |

OTHER PUBLICATIONS

KIPO Office action dated Dec. 29, 2009, for priority Korean application 10-2008-0118052, noting listed references in this IDS.
Patent Abstracts of Japan, Publication No. 2008-004837; dated Jan. 10, 2008 in the name of Yasuyuki Okabe, et al.
Korean Patent Abstracts, Publication No. 100662557; dated Dec. 21, 2006 in the name of Jae Hoon Jung.
Korean Patent Abstracts, Publication No. 1020080003057; dated Jan. 7, 2008 in the name of In Sun Yoo, et al.
Korean Patent Abstracts, Publication No. 1020080025500; dated Mar. 21, 2008 in the name of Jae Hoon Jung, et al.

* cited by examiner

*Primary Examiner* — Tucker Wright
(74) *Attorney, Agent, or Firm* — Christie, Parker & Hale, LLP

(57) ABSTRACT

A top emission organic light emitting display and a method of manufacturing the same. The organic light emitting display includes a substrate, a plurality of thin film transistors (TFT) on the substrate, a plurality of first electrodes coupled to the plurality of TFTs, auxiliary electrodes having a mesh structure defining areas where the plurality of first electrodes are located, a pixel defining layer on a substantially entire area of the substrate and patterned to expose the first electrodes and the auxiliary electrodes, an organic light emission layer on the substantially entire area of the substrate including the exposed first electrodes and auxiliary electrodes, and second electrodes on the organic light emission layer. Steps are formed at lower parts of the auxiliary electrodes, and the second electrodes are coupled to the auxiliary electrodes through contact regions in which the auxiliary electrodes are exposed due to the steps.

8 Claims, 9 Drawing Sheets

ORGANIC LIGHT EMITTING DISPLAY

CROSS-REFERENCE TO RELATED APPLICATION

This application claims priority to and the benefit of Korean Patent Application No. 10-2008-0118052, filed on Nov. 26, 2008, in the Korean Intellectual Property Office, the entire content of which is incorporated herein by reference.

BACKGROUND OF THE INVENTION

1. Field of the Invention

The present invention relates to a top emission organic light emitting display and a method of manufacturing the same.

2. Description of the Related Art

An organic light emitting display having a self-emission characteristic includes a substrate on which pixels are arranged, an encapsulating substrate arranged to face the substrate, and a sealant for sealing the pixels between the substrate and the encapsulating substrate.

The organic light emitting display having the above structure is categorized as having a top emission structure or a bottom emission structure in accordance with the direction in which light is emitted from the organic light emission layers of the pixels. The top emission structure in which light is emitted in the direction of the encapsulating substrate has a higher aperture ratio than that of the bottom emission structure in which light is emitted in the direction of the substrate on which the pixels are arranged.

Since light is emitted in the direction of the encapsulating substrate in the organic light emitting display having the top emission structure, the cathode electrodes are required to be formed of a transparent electrode material such as indium tin oxide (ITO) and indium zinc oxide (IZO). However, since the transparent electrode material has a high resistivity, when the cathode electrodes are formed on the top of the display region in the form of a common electrode, a voltage difference between two locations at the common electrode occurs in accordance with the positions of the pixels corresponding to the two locations so that picture quality becomes non-uniform. That is, since a difference in brightness occurs among the pixels due to a voltage difference (voltage drop) between the positions of the pixels close to an external power source and the positions of the pixels remote from the external power source, picture quality deteriorates.

SUMMARY OF THE INVENTION

Accordingly, it is an aspect of the present invention to provide an organic light emitting display including mesh type auxiliary electrodes in order to uniformly maintain the voltages of cathode electrodes.

It is another aspect of the present invention to provide a method of manufacturing an organic light emitting display in which auxiliary electrodes are coupled to cathode electrodes through contact regions generated by steps at a lower part of the auxiliary electrodes in order to facilitate manufacturing processes.

In order to achieve the foregoing and/or other aspects of the present invention, according to an embodiment of the present invention, there is provided an organic light emitting display including a substrate, a plurality of thin film transistors (TFTs) on the substrate, a plurality of first electrodes coupled to the plurality of TFTs, auxiliary electrodes having a mesh structure defining areas where the plurality of first electrodes are located, a pixel defining layer on a substantially entire area of the substrate, the pixel defining layer patterned to expose the first electrodes and the auxiliary electrodes, an organic light emission layer on the substantially entire area of the substrate, the exposed first electrodes and the exposed auxiliary electrodes, and second electrodes on the organic light emission layer. Steps are formed at lower parts of the auxiliary electrodes, and the second electrodes are coupled to the auxiliary electrodes through contact regions in which the auxiliary electrodes are exposed due to the steps.

According to another embodiment of the present invention, there is provided a method of manufacturing an organic light emitting display, the method including forming an active layer having a source region, a drain region and a channel region on a substrate, forming a gate insulating layer on a substantially entire area of the substrate, forming a gate electrode and auxiliary wiring lines on the gate insulating layer, forming an interlayer insulating layer on the substantially entire area of the substrate, patterning the interlayer insulating layer to expose the source region, the drain region and the auxiliary wiring lines, forming a source electrode and a drain electrode coupled to the source region and the drain region, respectively, forming first auxiliary electrodes coupled to the auxiliary wiring lines, forming a planarization layer on the substantially entire area of the substrate, patterning the planarization layer to expose the source electrode or the drain electrode, and the first auxiliary electrodes, forming a first electrode coupled to the source electrode or the drain electrode, forming second auxiliary electrodes intersecting the first auxiliary electrodes, forming a pixel defining layer on the substantially entire area of the substrate, patterning the pixel defining layer to expose the first electrode and the first auxiliary electrodes, and forming an organic light emission layer and a second electrode on the substantially entire area of the substrate. Steps are formed at portions of the first auxiliary electrodes on steps of the auxiliary wiring lines and the interlayer insulating layer, and the second electrode is coupled to the first auxiliary electrodes through the contact regions where the first auxiliary electrodes are exposed due to the their steps.

According to still another embodiment of the present invention, there is provided a method of manufacturing an organic light emitting display, the method including forming an active layer having a source region, a drain region and a channel region on a substrate, forming a gate insulating layer on a substantially entire area of the substrate, forming a gate electrode and auxiliary wiring lines on the gate insulating layer, forming an interlayer insulating layer on the substantially entire area of the substrate, patterning the interlayer insulating layer to expose the source region, the drain region and the auxiliary wiring lines, forming a source electrode and a drain electrode coupled to the source region and the drain region respectively, forming first auxiliary electrodes coupled to the auxiliary wiring lines, forming a planarization layer on the substantially entire area of the substrate, patterning the planarization layer to expose the source electrode or the drain electrode, and the first auxiliary electrodes, forming a first electrode coupled to the source electrode or the drain electrode, second auxiliary electrodes intersecting the first auxiliary electrodes, and third auxiliary electrodes overlapping the first auxiliary electrodes, forming a pixel defining layer on the substantially entire area of the substrate, patterning the pixel defining layer to expose the first electrode and the third auxiliary electrodes, and forming an organic light emission layer and a second electrode on the substantially entire area of the substrate. Steps are formed at portions of the first auxiliary electrodes and portions of the third auxiliary electrodes on steps of the auxiliary wiring lines and the interlayer insulating layer. The second electrode is coupled to the third auxiliary electrodes through the contact regions where the third auxiliary electrodes are exposed due to their steps.

In the organic light emitting display according to the present invention, the auxiliary electrodes having the mesh structure are formed in the display region and the auxiliary electrodes are coupled to the cathode electrodes through the contact regions formed by the step parts in a lower part. The voltage of the cathode electrodes is uniformly maintained regardless of the positions of the pixels due to the auxiliary electrodes having the mesh structure so that a difference in brightness among the pixels is not generated. In addition, the auxiliary electrodes are coupled to the cathode electrodes through the contact regions formed by the step parts in the lower part so that manufacturing processes can be easily performed.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF EXEMPLARY EMBODIMENTS

Figure 1:
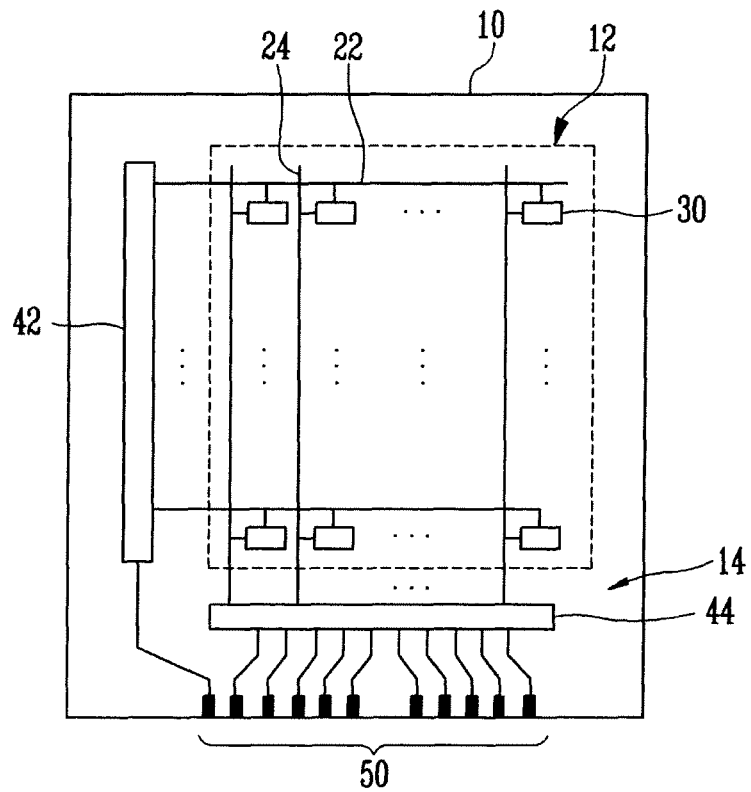
FIG. 1 is a schematic drawing illustrating a plan view of an organic light emitting display according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on another element or be indirectly on another element with one or more intervening elements interposed therebetween. Also, when an element is referred to as being "coupled to" another element, it can be directly coupled to another element or be indirectly coupled to another element with one or more intervening elements interposed therebetween. Hereinafter, like reference numerals refer to like elements.

The present invention will now be described more fully with reference to the accompanying drawings, in which exemplary embodiments of the invention are shown. The present invention may, however, be embodied in many different forms and should not be construed as being limited to the embodiments set forth herein; rather, the exemplary embodiments are provided so that this disclosure will be thorough and complete, and will fully convey the concept of the invention to those skilled in the art.

Figure 2:
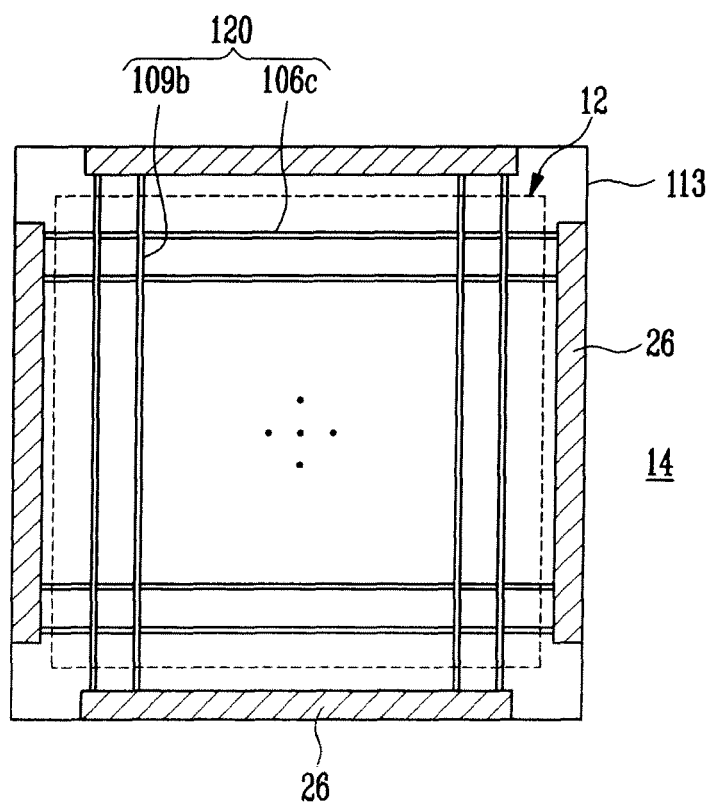
FIG. 2 is a schematic drawing illustrating a plan view of auxiliary electrodes and a cathode electrode according to an embodiment of the present invention.

FIGS. 1 and 2 are schematic drawings illustrating plan views of an organic light emitting display according to a first embodiment of the present invention.

Referring to FIG. 1, a substrate 10 includes a display region 12 and a non-display region 14 around the display region 12. In the display region 12, a plurality of pixels 30 coupled to scan lines 22 and data lines 24 are arranged in a matrix. In the non-display region 14, drivers 42 and 44, which provide signals to the scan lines 22 and the data lines 24 respectively, and a pad unit 50, which receives signals from the outside, are provided.

The pixels 30 include anode electrodes, organic light emission layers, and cathode electrodes and can further include thin film transistors (TFT) that operate as switches.

Referring to FIG. 2, a cathode electrode 113 is provided on the top of the display region 12 in the form of a common electrode. In addition, the cathode electrode 113 is coupled to auxiliary electrodes 120 provided under the cathode electrode 113 and is coupled to the pad unit 50 through bus lines 26 formed in the non-display region 14. The auxiliary electrodes 120 include first auxiliary electrodes 106c and second auxiliary electrodes 109b forming a mesh structure, and are coupled to the cathode electrode 113 through contact regions formed on the first auxiliary electrodes 106c.

Figure 3:
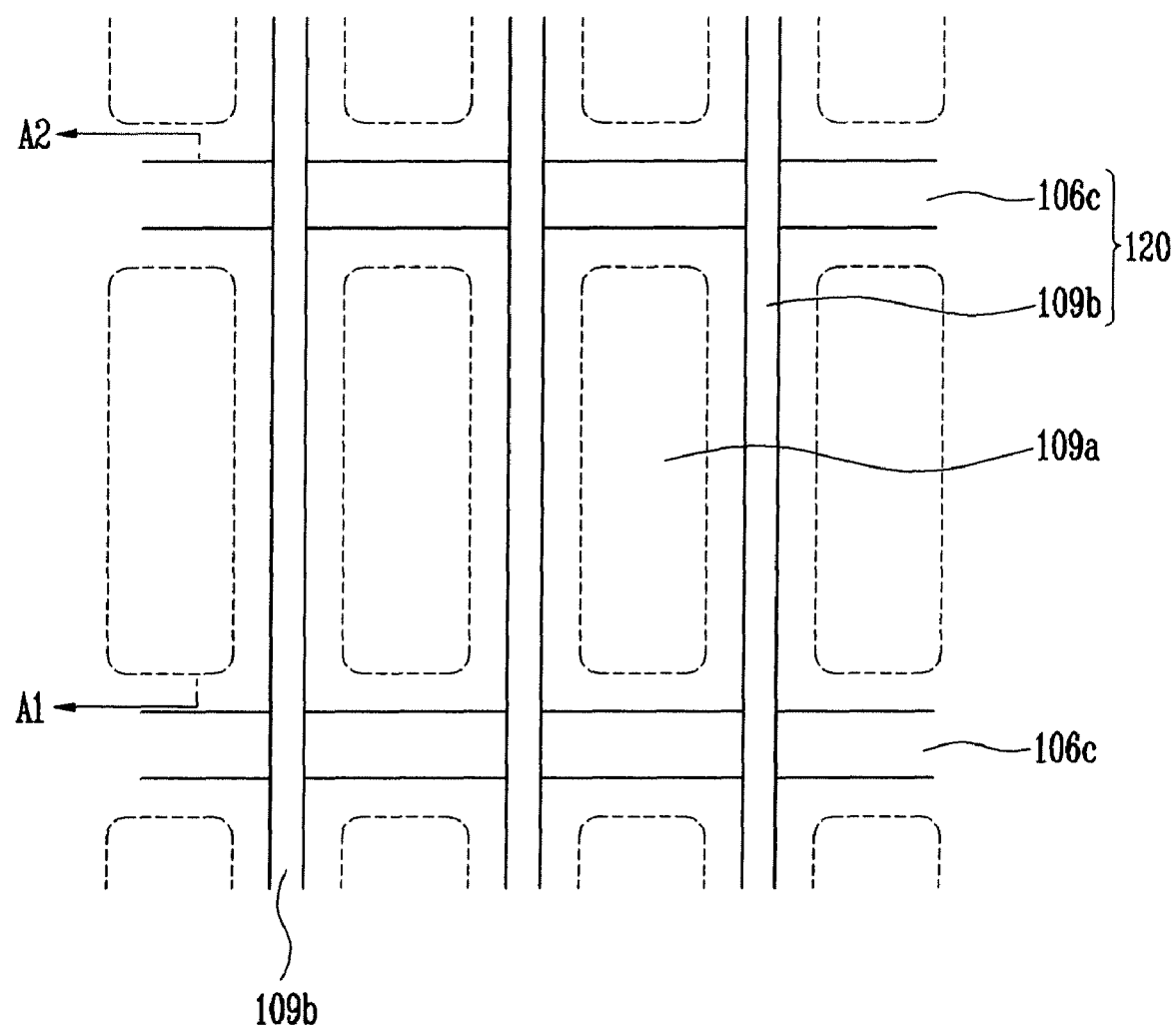
FIG. 3 is a schematic drawing illustrating an enlarged plan view of a display region according to a first embodiment of the present invention.
Figure 4:
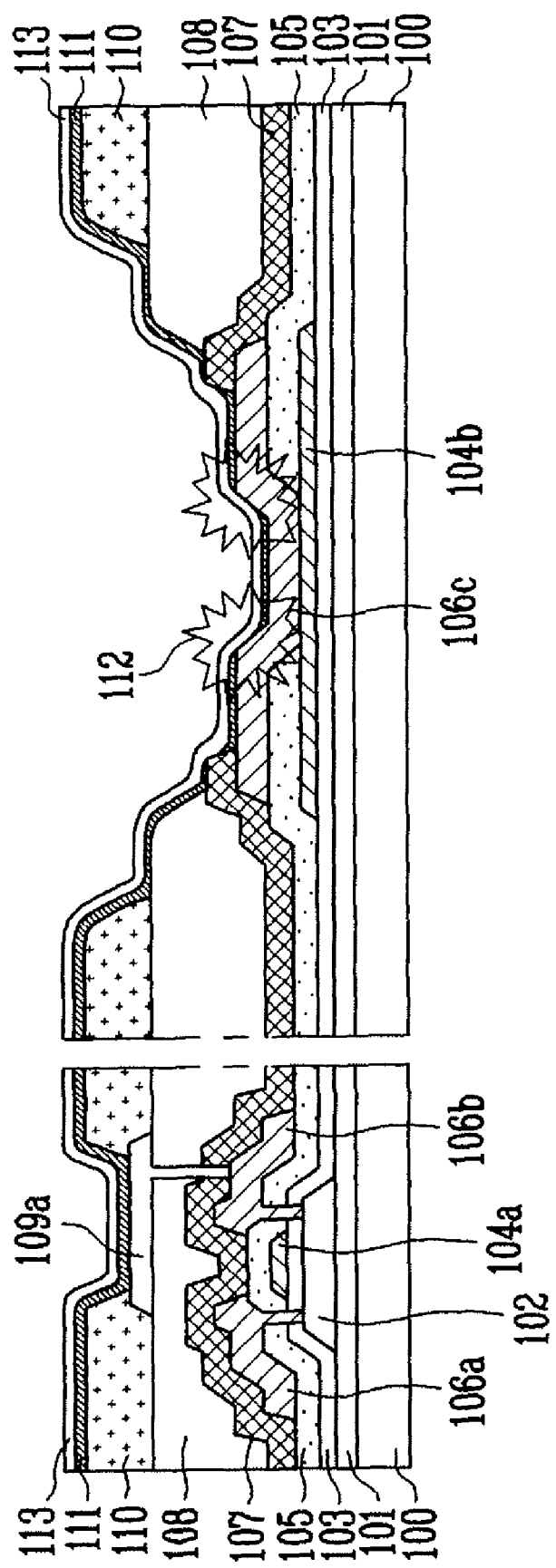
FIG. 4 is a schematic drawing illustrating a sectional view taken along the line A1-A2 of FIG. 3.

FIG. 3 is a schematic drawing illustrating an enlarged plan view of the display region 12 illustrated in FIG. 2. FIG. 4 is a schematic drawing illustrating a sectional view taken along the line A1-A2 of FIG. 3.

Referring to FIGS. 3 and 4, the auxiliary electrodes 120 in the mesh structure include the first auxiliary electrodes 106c extending in one direction (X direction) and the second auxiliary electrodes 109b extending in another direction (Y direction), and the first auxiliary electrodes 106c and the second auxiliary electrodes 109b are coupled to each other at their intersections forming a laminated structure. The auxiliary electrodes 120 having the mesh structure define areas where the plurality of pixels 30 are located and are coupled to the cathode electrode 113 through contact regions 112 where the first auxiliary electrodes 106c are exposed due to steps formed in its lower part.

Next, embodiments of the present invention will be described in detail through a method of manufacturing the organic light emitting display according to the first embodiment.

FIGS. 5A to 5E are schematic drawings illustrating sectional views of the method of manufacturing the organic light emitting display according to the first embodiment.

Figure 5A:
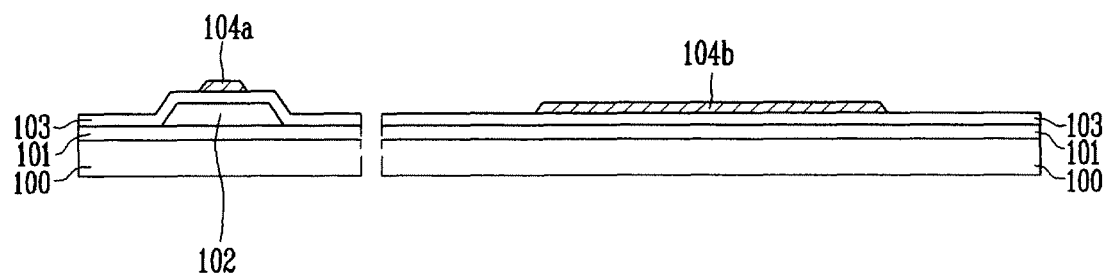
FIGS. 5A, 5B, 5C, 5D and 5E are schematic drawing illustrating sectional views of a method of manufacturing an organic light emitting display according to the first embodiment of the present invention.

Referring to FIG. 5A, a buffer layer 101 is formed on a substrate 100, and a semiconductor active layer 102 that provides source and drain regions and a channel region is formed on the buffer layer 101. A gate insulating layer 103 and a conductive layer are formed on the substantially entire area of the substrate 100 including the active layer 102. The conductive layer is patterned so that a gate electrode 104a is formed on the gate insulating layer 103 of a channel region and that an auxiliary wiring line 104b is formed in a region between the pixels 30.

Figure 5B:
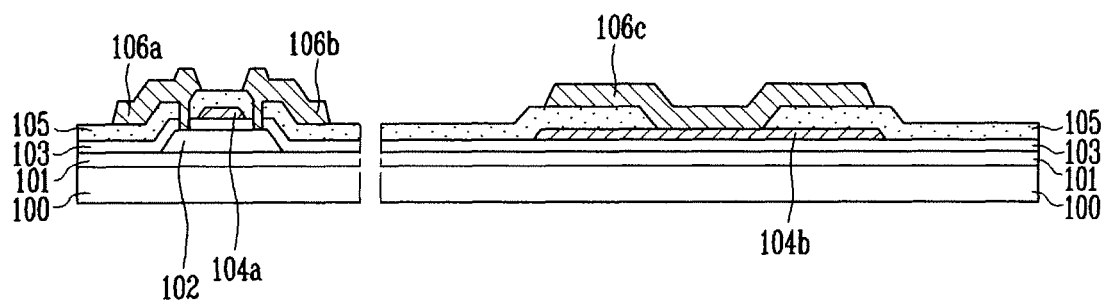

Referring to FIG. 5B, an interlayer insulating layer 105 is formed on the substantially entire area of the substrate, and the interlayer insulating layer 105 and the gate insulating layer 103 are patterned so that the source and drain regions of the active layer 102 and a predetermined part of the auxiliary wiring line 104b are exposed via contact holes. Another conductive layer is formed on the interlayer insulating layer 105 and is patterned so that the contact holes are buried to form source and drain electrodes 106a and 106b that are coupled to the source and drain regions of the active layer 102 through the contact holes, and the first auxiliary electrodes 106c that are coupled to the auxiliary wiring line 104b. The first auxiliary electrodes 106c extend in one direction (X direction) in stripes. Here, the first auxiliary electrodes 106c are formed to be wider than the contact holes that expose the auxiliary wiring line 104b so that steps caused by the contact holes are directly maintained in the first auxiliary electrodes 106c.

Figure 5C:
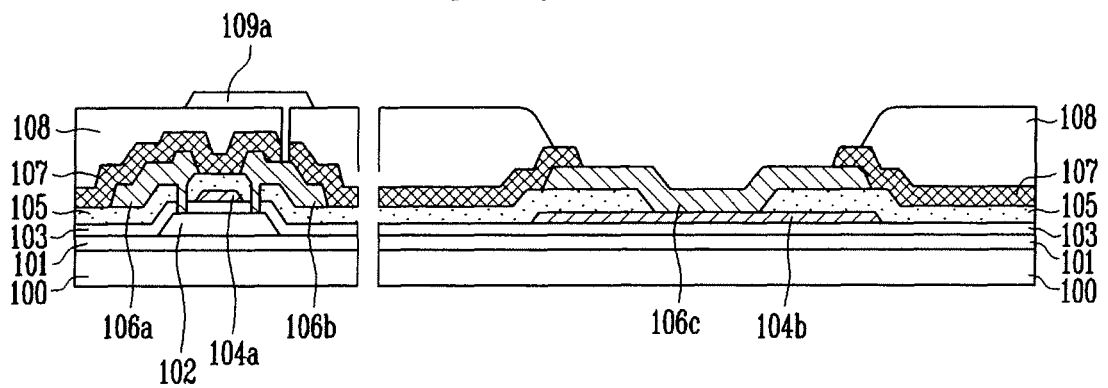

Referring to FIG. 5C, a protective layer 107 and a planarization layer 108 are formed on the substantially entire area of the substrate and are patterned to form via holes so that predetermined parts of the source 106a or drain electrode 106b and the first auxiliary electrodes 106c are exposed. A conductive layer is formed on the planarization layer 108 so that the via holes are buried and is patterned to form an anode electrode 109a coupled to the source or drain electrode 106a or 106b, and the second auxiliary electrodes 109b that intersect the first auxiliary electrodes 106c through the via holes. The second auxiliary electrodes 109b extend in another direction (Y direction) in stripes.

Figure 5D:
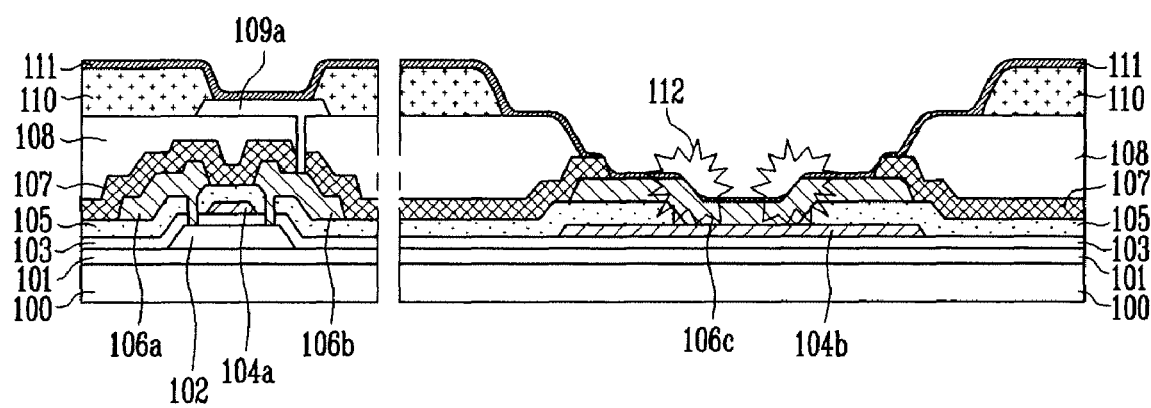

Referring to FIG. 5D, a pixel defining layer 110 is formed on the substantially entire area of the substrate including the anode electrode 109a. The pixel defining layer 110 is patterned so that a predetermined part (an emission region) of the anode electrode 109a and the first auxiliary electrode 106c are exposed, and an organic light emission layer 111 is formed on the substantially entire area of the substrate. Here, since steps are formed on the first auxiliary electrode 106c due to the contact holes of the interlayer insulating layer 105 on the auxiliary wiring line 104b, the portions of the organic light emission layer 111 covering the edges of the steps are deteriorated (or thinned) so that the contact regions 112 are formed to expose the second auxiliary electrode 106c.

Figure 5E:
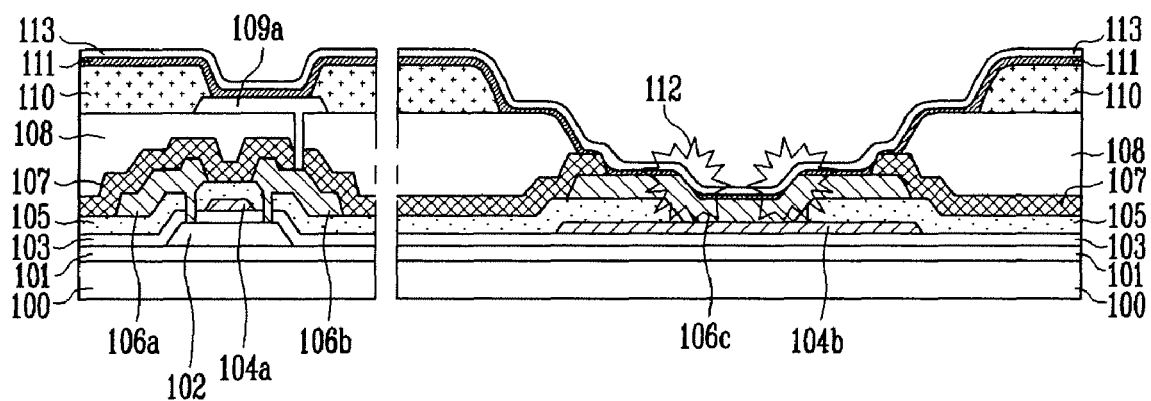

Referring to FIG. 5E, the cathode electrode 113 is formed on the substantially entire area of the substrate. The cathode electrode 113 is coupled to the first auxiliary electrode 106c through the contact regions 112 and is coupled to the pad unit 50 through the bus lines 26 formed in the non-display region 14.

Figure 6:
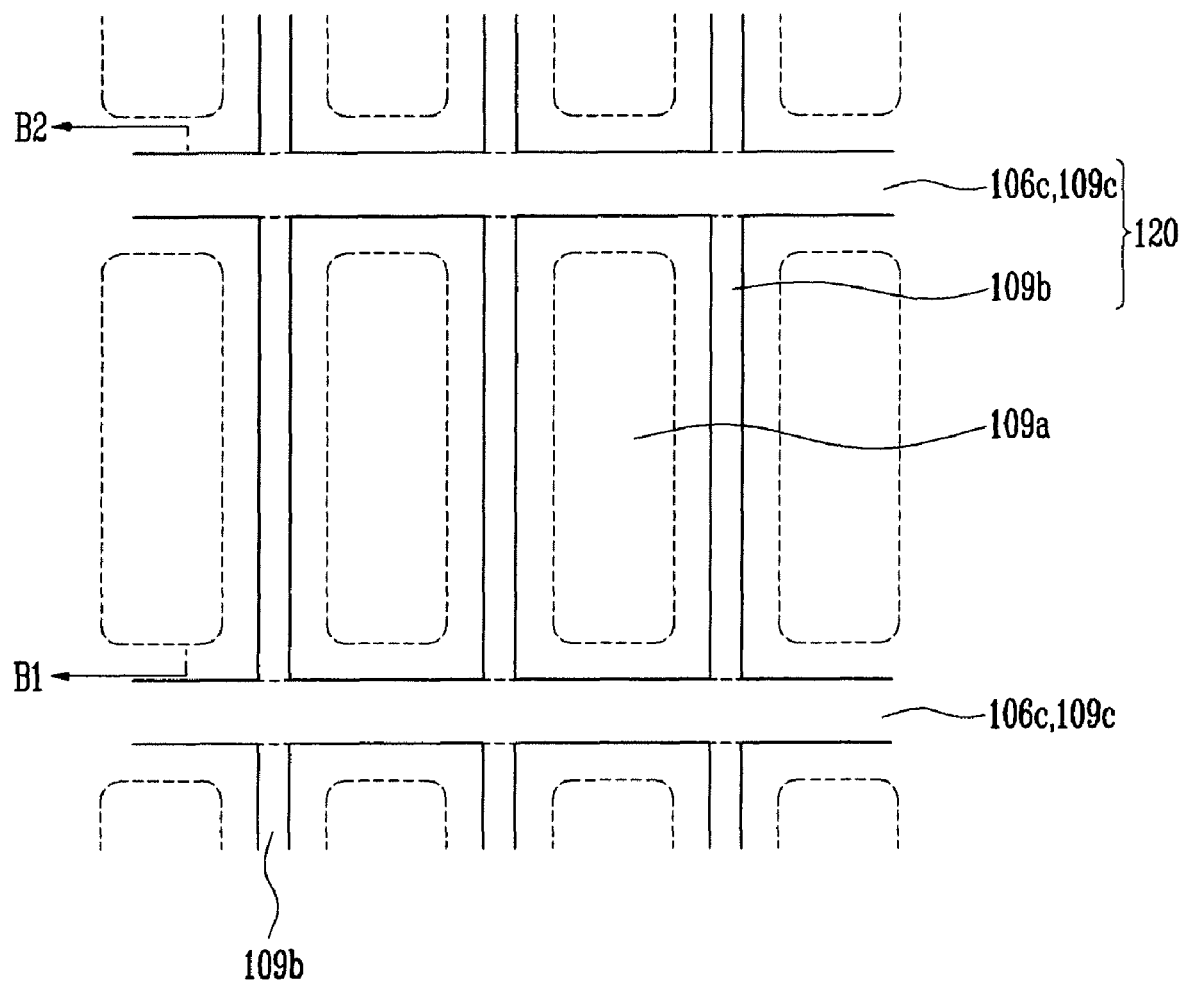
FIG. 6 is a schematic drawing illustrating an enlarged plan view of a display region according to a second embodiment of the present invention.
Figure 7:
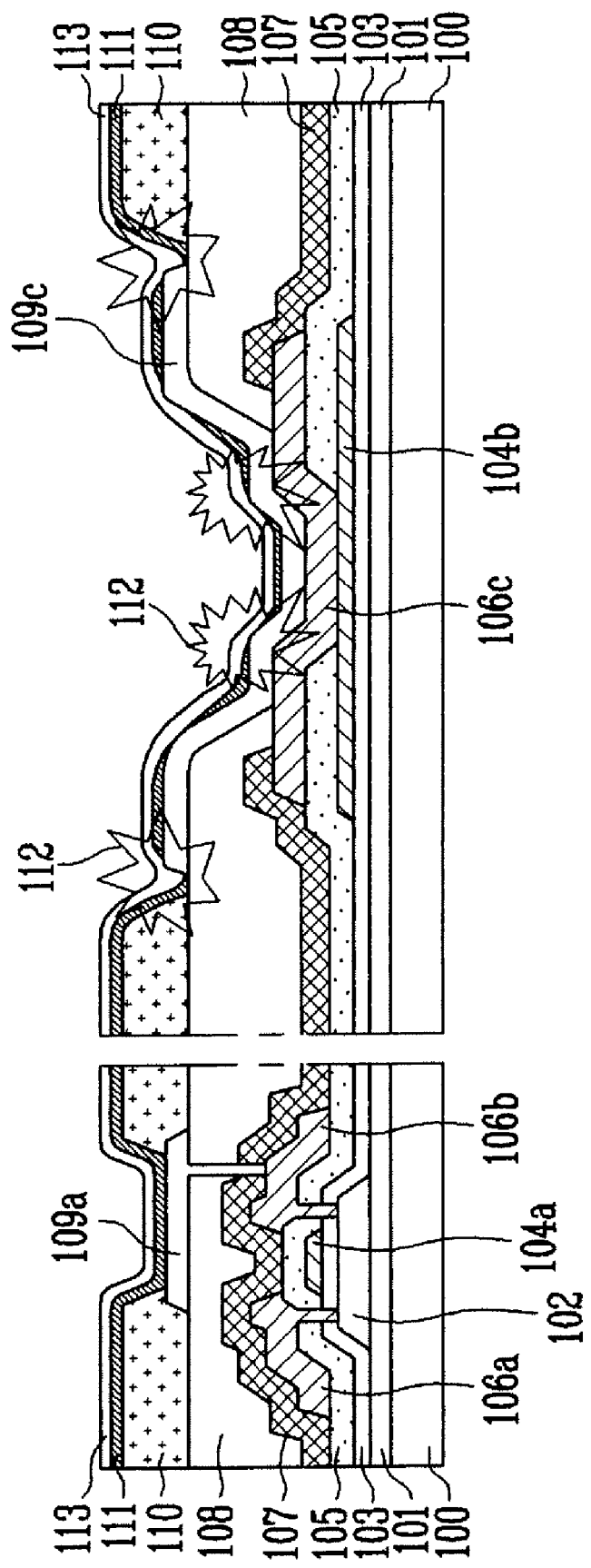
FIG. 7 is a schematic drawing illustrating a sectional view taken along the line B1-B2 of FIG. 6.

FIG. 6 is a plan view illustrating an organic light emitting display according to a second embodiment of the present invention, which is an enlarged plan view of a portion of the display region 12 illustrated in FIG. 2. FIG. 7 is a sectional view taken along line B1-B2 of FIG. 6.

According to the first embodiment, the first auxiliary electrode 106c extending in one direction (X direction) is formed of the material of the source and drain electrodes 106a and 106b that constitute a thin film transistor (TFT). However, according to the second embodiment of the present invention, the auxiliary electrode extending in one direction (X direction) is formed to have a laminated structure, which includes the material of the source and drain electrodes 106a and 106b that constitute the TFT and the material of the anode electrode 109a that constitutes the pixel 30. Since a larger number of contact regions 112 are formed by the auxiliary electrodes having the laminated structure than those of the first embodiment, the cathode electrode 113 can be more effectively coupled to the auxiliary electrodes.

FIGS. 8A to 8D are schematic drawings illustrating sectional views of a method of manufacturing an organic light emitting display according to the second embodiment of the present invention. Only the parts different from the parts in the first embodiment will be described.

Figure 8A:
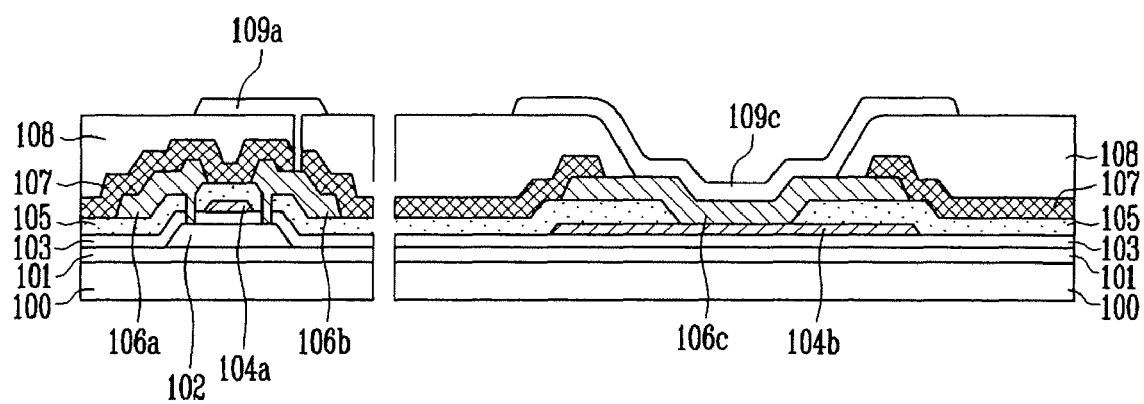
FIGS. 8A, 8B, 8C and 8D are schematic drawing illustrating sectional views of a method of manufacturing an organic light emitting display according to the second embodiment of the present invention.

Referring to FIG. 8A, after performing the processes of FIGS. 5A and 5B, when the anode electrode 109a coupled to the source or drain electrode 106a or 106b and the second auxiliary electrode 109b (shown in FIG. 6) that intersects the first auxiliary electrode 106c are formed in the process of FIG. 5C, a third auxiliary electrode 109c that overlaps the first auxiliary electrode 106c is formed on the first auxiliary electrode 106c.

Figure 8B:
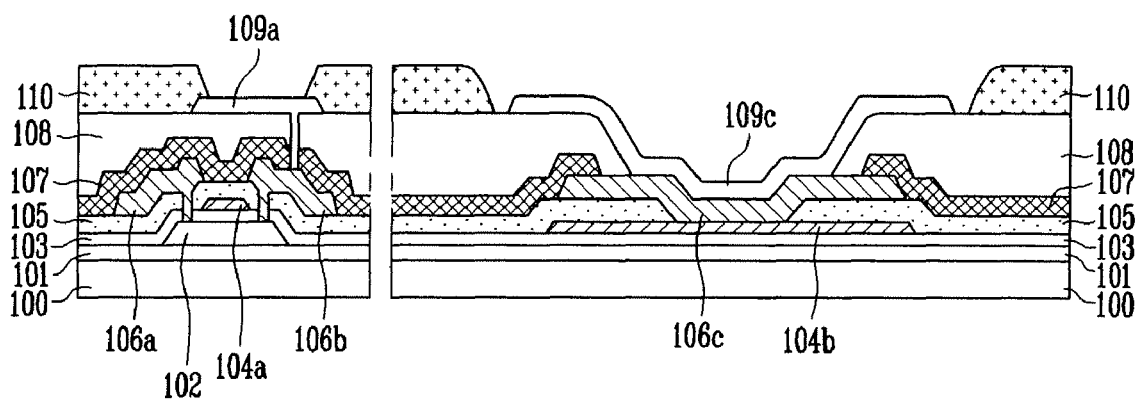

Referring to FIG. 8B, after forming the pixel defining layer 110 on the substantially entire area of the substrate including the anode electrode 109a, the pixel defining layer 110 is patterned so that a predetermined part (an emission region) of the anode electrode 109a and the third auxiliary electrode 109c are exposed. At this time, the pixel defining layer 110 is patterned to be separated from the third auxiliary electrode 109c by a predetermined distance so that the side wall of the third auxiliary electrode 109c is exposed.

Figure 8C:
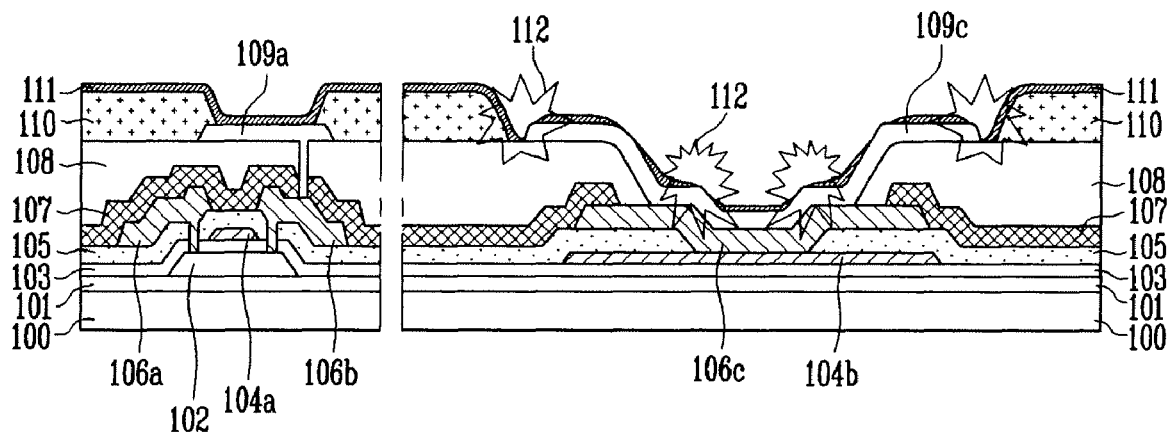

Referring to FIG. 8C, the organic light emission layer 111 is formed on the substantially entire area of the substrate. Here, since the steps of the first auxiliary electrode 106c formed by the contact holes of the interlayer insulating layer 105 on the auxiliary wiring line 104b are directly maintained in the third auxiliary electrode 109c, portions of the organic light emission layer 111 deteriorate at the edges of the steps. In addition, due to the steps on the side walls of the third auxiliary electrode 109c, portions of the organic light emission layer 111 deteriorate at the edges of the steps. Therefore, the plurality of contact regions 112 through which the third auxiliary electrode 109c is exposed are formed. That is, the contact regions 112 include the contact regions 112 formed by the steps formed in the third auxiliary electrode 109c due to the contact holes of the interlayer insulating layer 105 on the auxiliary wiring line 104b and the contact regions 112 formed by the steps on the side walls of the third auxiliary electrode 109c.

Figure 8D:
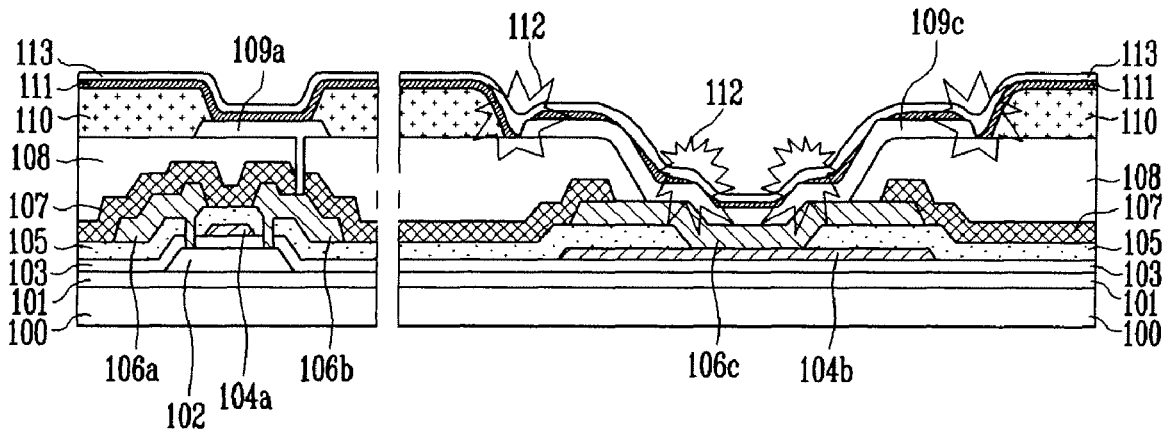

Referring to FIG. 8D, the cathode electrode 113 is formed on the substantially entire area of the substrate. The cathode electrode 113 is coupled to the third auxiliary electrode 109c through the contact regions 112 and is coupled to the pad unit 50 through the bus lines 26 formed in the non-display region 14.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:
1. An organic light emitting display comprising:
a substrate;
a plurality of thin film transistors on the substrate;
a plurality of first electrodes respectively coupled to the plurality of thin film transistors;
auxiliary electrodes having a mesh structure defining areas where the plurality of first electrodes are located;
a pixel defining layer on a substantially entire area of the substrate, the pixel defining layer patterned to expose the first electrodes and the auxiliary electrodes;

an organic light emission layer on the substantially entire area of the substrate, the organic light emission layer being on the exposed first electrodes and the exposed auxiliary electrodes; and second electrodes on the organic light emission layer, wherein at least one of the auxiliary electrodes has steps on a side thereof facing a direction opposite the substrate, and the second electrodes is coupled to the auxiliary electrodes through contact regions in which the auxiliary electrodes are exposed due to the steps.

2. The organic light emitting display as claimed in claim 1, wherein the auxiliary electrodes comprise first auxiliary electrodes extending in one direction and second auxiliary electrodes extending in another direction, the second auxiliary electrodes intersecting the first auxiliary electrodes forming the mesh structure.

3. The organic light emitting display as claimed in claim 2,
wherein the first auxiliary electrodes are formed of a same material as source and drain electrodes of the thin film transistors, the second auxiliary electrodes are formed of a same material as the first electrodes, and the first auxiliary electrodes and the second auxiliary electrodes are coupled to each other at their intersecting portions.

4. The organic light emitting display as claimed in claim 2, wherein the steps are formed by:

an interlayer insulating layer under the first auxiliary electrodes; and auxiliary wiring lines under the interlayer insulating layer, and coupled to the first auxiliary electrodes.

5. The organic light emitting display as claimed in claim 1, wherein the contact regions are formed at portions of the organic light emission layer deteriorated by the steps.

6. The organic light emitting display as claimed in claim 2,
wherein the first auxiliary electrodes have a laminated structure comprising a same material as source and drain electrodes of the TFTs and a same material as the first electrodes, the second auxiliary electrodes comprise the same material as the first electrodes, and the first auxiliary electrodes and the second auxiliary electrodes are coupled to each other at their intersecting portions.

7. The organic light emitting display as claimed in claim 6, wherein the pixel defining layer is patterned to be separated from the auxiliary electrodes.

8. The organic light emitting display as claimed in claim 7, wherein the contact regions comprise:

contact regions at portions of the organic light emission layer deteriorated by steps on edges of the auxiliary electrodes; and contact regions at portions of the organic light emission layer deteriorated by steps on side walls of the auxiliary electrodes.

* * * * *

UNITED STATES PATENT AND TRADEMARK OFFICE
CERTIFICATE OF CORRECTION

PATENT NO. : 8,188,473 B2
APPLICATION NO. : 12/566653
DATED : May 29, 2012
INVENTOR(S) : Hyun-Chol Bang et al.

Page 1 of 1

It is certified that error appears in the above-identified patent and that said Letters Patent is hereby corrected as shown below:

On the Title Page

(30) Foreign Application Priority Data       Insert -- (30) Foreign Application Priority Data

November 26, 2008 (KR) 10-2008-0118052 --

In the Claims

Column 7, Claim 1, line 5       Delete "second electrodes"
                                Insert -- a second electrode --

Column 7, Claim 1, line 8       Delete "electrodes"
                                Insert -- electrode --

Column 8, Claim 6, line 6       Delete "Claim 2"
                                Insert -- Claim 1 --

Signed and Sealed this
Twenty-fourth Day of September, 2013

Teresa Stanek Rea
*Deputy Director of the United States Patent and Trademark Office*